(12) United States Patent
Akdemir et al.

(10) Patent No.: US 9,470,760 B2
(45) Date of Patent: Oct. 18, 2016

(54) FUNCTIONAL ASIC VERIFICATION USING INITIALIZATION MICROCODE SEQUENCE

(75) Inventors: Birol Akdemir, Gaertringen (DE); Onur Keles, Boeblingen (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 597 days.

(21) Appl. No.: 13/422,037

(22) Filed: Mar. 16, 2012

(65) Prior Publication Data

US 2012/0253731 A1 Oct. 4, 2012

(30) Foreign Application Priority Data

Apr. 1, 2011 (EP) ..................................... 11160792

(51) Int. Cl.
*G01R 31/00* (2006.01)
*G01R 31/319* (2006.01)
*G01R 31/3183* (2006.01)

(52) U.S. Cl.
CPC . *G01R 31/31917* (2013.01); *G01R 31/318371* (2013.01)

(58) Field of Classification Search
CPC ................ G01R 31/31917; G01R 31/318371; G01R 31/3181; G01R 31/3183; G01R 31/31704; G01R 31/31724; G01R 31/318533
USPC .......................................................... 702/119
See application file for complete search history.

(56) References Cited

U.S. PATENT DOCUMENTS

| | | | |
|---|---|---|---|
| 4,519,035 A * | 5/1985 | Chamberlain | 712/15 |
| 5,581,742 A * | 12/1996 | Lin et al. | 716/113 |
| 6,125,460 A * | 9/2000 | Sim | 714/718 |
| 2004/0051547 A1* | 3/2004 | Ma et al. | 324/763 |
| 2005/0204231 A1* | 9/2005 | Mukherjee et al. | 714/733 |
| 2007/0176621 A1* | 8/2007 | Tanamachi | 324/765 |
| 2011/0219208 A1* | 9/2011 | Asaad et al. | 712/12 |

* cited by examiner

*Primary Examiner* — Mischita Henson
(74) *Attorney, Agent, or Firm* — Patterson + Sheridan, LLP (57) ABSTRACT

A method of wafer-level testing of a register programmable integrated circuit may be provided. The method may comprise transforming a microcode instruction and related data from an initializing processor format into tester format data, and applying the tester format data to the integrated circuit on a wafer.

19 Claims, 6 Drawing Sheets

FUNCTIONAL ASIC VERIFICATION USING INITIALIZATION MICROCODE SEQUENCE

FIELD OF THE INVENTION

The invention relates generally to a method and a system of wafer-level testing of a register programmable integrated circuit. The invention relates further to a data processing program, and a computer program product.

BACKGROUND OF THE INVENTION

VLSI (very large scale integration) design is making constant progress. Complexity is increasing and die sizes are decreasing. In parallel, costs are increasing and time-to-market requirements decrease at the same time. Therefore, it is a strong requirement to forward only working intermediate elements to a next production process. This applies also to ASICs (application specific integrated circuit). A key role in quality assurance of a production process for such ASICs take tests at every possible stage in order to avoid continuation with a non-working part in a subsequent production step. During the manufacturing process, electronic circuit testing generally occurs at many levels of integration of the circuit via various testing techniques. Generally, testing may occur at wafer level, package level, multi-chip module level, board level, and system level. Wafer level testing may happen during early stages of a production process, namely before a singularization, i.e., before the chips or dies may be separated from each other and the remaining parts of a wafer.

A goal of testing at each level is to detect as many defect circuits as possible as early as possible in the production process. Passing a defect circuit to a next production phase may increase the overall production costs. The later a defect may be detected, the higher the overall costs may be. Therefore, manufacturers of such devices are strongly interested to decrease the number of defect parts as early as possible in the production process.

At wafer level, the testing goal may be to separate good dies from bad ones before sawing and component packaging. However, it may be understood that a complete functional test may only be possible at board and/or system level, i.e., if all supporting mechanical, electrical, and electronic elements are assembled in a final product. In production phases or levels thereof, only substitute tests may be performed. That may include parametric testing, including current monitoring testing at wafer level and/or built-in self tests. These so-called BISTs at wafer level may use automated hardware-based tests included inside the tested chip which may allow the circuit to test itself. A BIST may occur online during normal operation of the chip during an idle state or offline when the circuit may be placed in a special test mode. During wafer level testing, online BIST may be employed and may generally include a hardware pseudo-random vector generator and signature analysis hardware. Although the BIST techniques may be an effective method of detecting so-called "stuck-at" and delay type faults, it may require costly testing time and die space for a required ROM (read-only memory). Additionally, in a ROM-based BIST, the micro-program-based functional test may be developed and frozen by R&D in the design stage before a product may be ramped to production. Thus, the ROM-based BIST is static and alterations may not be possible at all.

Several attempts have been made in order to better test ASICs and other VLSI chips. Document U.S. Pat. No. 5,937,154 discloses a manufacturing test system and method for testing a computing system under test, which includes a computing device comprising internal emulation debug hardware, and an emulation debug port through which the debug hardware is controlled. Manufacturing-level microprogram based functional tests are executed under the control of the internal emulation debug hardware of the computing device. A computing system probe applies the microprogram-based functional test to the internal emulation debug hardware of the computing device via the emulation debug port. The manufacturing-level micro-program-based functional test may be executed at any level of a computing device integration including the wafer, package, board, multi-chip module and system levels.

Document U.S. Pat. No. 6,825,682B2 discloses a test configuration for the functional testing of a semiconductor chip. The semiconductor chip, which can be subjected to a functional test for the purpose of checking the functionality of the semiconductor chip, is disposed on a support material. The semiconductor chip contains a self-test unit for generating test information and for carrying out the functional test. An energy source serves for providing an electrical energy supply for energy that is fed-in contactlessly. The energy source is disposed on the support material and is connected to the semiconductor chip for the purpose of providing an energy supply. The test configuration makes it possible to carry out a contactless functional test and to reduce the test costs by virtue of high parallelism during the functional test of a plurality of semiconductor chips.

It may also be understood that due to the complexity of today's VLSI ASICs, a complete test of all statuses and functions may not be feasible. This may apply in particular, if the VLSI ASIC may include a complete processor, memory and other supporting devices. It may become even more difficult if the processor's functionality may be altered by using different microcode sets. The term microcode may denote a set of instructions that may be stored inside the processor during an initialization phase. It may determine the function of the processor and its behavior in respect to external/conventional program code and data. Thus, different microcode sets may result in a different behavior of a processor to the same external/conventional program code and data. In such a scenario, a complete test of all possible microcode sets in combination with all possible external program code and data may not be feasible. Even a small subset of combinations would lead to an explosion of production cost. It may be noted that instead of the term "microcode" the term "firmware" may also be used. Also the term "micro-program" may be a substitute for the term "microcode".

However, because of the limitations of the technology of the state of the art, there may be a requirement for an improved method and system for a better testability of VLSI chips that may not rely on built-in-self-tests or random signal generators. These test measures may be too late or to imprecise.

SUMMARY OF THE INVENTION

This need may be addressed by a method of wafer-level testing of a register programmable integrated circuit as well as by a system of wafer-level testing of a register programmable integrated circuit.

According to one embodiment, a method of wafer-level testing of a register programmable integrated circuit may be provided. The method may comprise transforming a microcode instruction and related data from an initializing processor format into tester format data, and applying the tester format data to the integrated circuit on a wafer.

In another embodiment, a system of wafer-level testing of a register programmable integrated circuit may be provided. The system may comprise a transforming unit adapted for transforming a microcode instruction and related data from an initializing processor format into tester format data, and an applying unit adapted for applying the tester format data to the integrated circuit on a wafer.

DETAILED DESCRIPTION OF THE INVENTION

It may be noted that the microcode instruction may, in particular, comprise read and write instructions plus related data to registers of the circuit. The initializing processor format may be a format generated by a processor that may initialize the circuit. The processor may particularly be a central electronic complex (CEC) of a computer system comprising the circuit. Thus, the microcode used by the circuit may be downloaded from the CEC to the circuit during an initialization.

Additionally, it may be understood that applying the tester format data to the integrated circuit may, in particular, be performed to a plurality of circuits of the wafer. Applying the tester format data may be performed to the circuits particularly one after another. It may be understood that the wafer-testing level may be applied by this method.

In the context of this application, the following principle terms may be used:

Wafer-level testing—The term wafer level testing may denote tests of a chip that may not have been singularized. A plurality of chips or dies may still be on a wafer. The chips or pre-production elements thereof may be tested still being part of the wafer. The chips or the pre-production elements thereof may be tested one after the other.

Register programmable integrated circuit—This term may denote a register programmable ASIC, or in short ASIC—which may have been produced as a VLSI chip—being able to execute functions, e.g., I/O functions for a larger processor complex. The ASIC's internal functions, in particular a reaction to external signals, e.g., input signals, may be defined by the content of registers to be loaded externally. Consequently, the ASIC may behave differently to external signals depending on the content of loaded registers which may have been loaded with specific bit patterns before the external signals may be applied. This may be useful for, e.g., an I/O ASIC, controlling input and output operations of a computer system that may have different functions depending on the overall system the I/O ASIC may be part of. It may behave differently in a mainframe computer system if compared to a midrange computer system.

Tester—A tester may denote automatic test equipment for semiconductor testing. The automatic test equipment may apply power to the devices under test (DUT), supply stimulus signals and measure and evaluate resulting outputs from the DUT. Microscopic needles may be used by testers to contacts wafer level ASCIs, or other VLSI chips, or pre-production elements thereof.

Tester format data—The term tester format data may denote data that may be used as input signals for a tester. Testers may be controlled by such tester data. The data may be delivered to the tester in a format the tester may interpret and use to test the DUT. Thus, the tester format may be pre-defined.

Global error macro—The term global error macro may denote a register internal to the processor that may signal a malfunction of a firmware-code instruction, e.g., processor internal signal conflict or timing errors. It may be implemented as a 64-bit register with all registers containing a "0" if no error may occur. In case of an internal error, e.g., caused by a firmware-code instruction malfunction, one or more registers may change its content from "0" to "1". The global error macro may be instrumental during testing.

Initialization—The term initialization may denote a process of loading a processor or—more generally—a circuit with a set of firmware-codes. After the initialization the processor's or circuit's functions and instructions accessible from external by a program—or, in particular, by I/O instruction sequences—may be determined.

Central electronic complex—The term central electronic complex (CEC) may denote a central processing system, or parts thereof, of a computer system. The term may typically be used in the context of mainframe computers. However, in some instances it may also be used for RISC (reduced instruction set computer) systems.

The above-described method of wafer-level testing of a register programmable integrated circuit may provide a couple of advantages. In particular, the method may allow testing an ASIC, particularly in form of a processor at wafer-level with real microcode-code instructions instead of artificial codes that may not be relevant for "real-life" situations. The instructions being used may comprise instructions used for initialization of the microcode code programmable processor or circuit as defined above. This may be the earliest time in a production process a processor or circuit to be manufactured may be exposed to microcode instructions. No artificial or pseudo-random pattern may be used but those microcode code elements that may later in a real-life environment being used as initialization instructions for the processor. Malfunctions of ASICs may be detected at a very early stage of the production process, thus, separating good dies from bad dies. This testing method may be used before singularizing individual chips by sawing a wafer. It may make a final system obsolete, or at least in parts obsolete, saving time and money.

In one embodiment, the method may also comprise performing hardware and software verification by reading a global error indicator from the integrated circuit on the wafer after applying the tester format data to the integrated circuit. The global error indicator may, in particular, be a global error macro as defined above. Performing the hardware and software verification may particularly be done such that an ASIC function may be verified for correctness indicated by the global error indicator. E.g., all bits of the global error macro may be set to zero if a function may be performed correct. In case of an error or a signaling conflict, or the like, at least one bit may be set to "1" indicating a mal-function of the ASIC.

In another embodiment of the method, applying the tester format data to the integrated circuit on the wafer may comprise writing the data to the integrated circuit, in particular, to registers of the circuit or reading, in particular, other data from the integrated circuit, particularly from registers of the circuit. In typical cases, many more write cycles may be performed than read cycles. Read instructions may be used to identify the type of ASIC. A typical word size may be 64 bit. However, other word lengths, e.g., 32 bit, 128 bit or 256 bits may be applied.

In yet another embodiment, the method may comprise generating the microcode code instruction by simulating a data exchange between a simulated central electronic complex, and simulating the integrated circuit. This set-up may allow a test in a completely simulated environment. It may allow a test even before any of the hardware components may have been manufactured. This approach may decrease the development time of new systems and interdependencies between components of new systems, in particular, a CEO and an I/O ASIC.

In again another embodiment of the method, the simulation of the integrated circuit may be performed by using a high level design language simulator or a hardware design language simulator, in particular, a VHDL-Simulator. The high level design language simulator may be, e.g., SystemC from OSCI—the Open SystemC Initiative. Thus, tests may be designed in a phase the real chip may not have been produced. Additionally, developers may use a standardized design language that may be used for other purposes as well. Hence, skills of the developers may be reused.

In again another embodiment of the method, the tester format data may be data for a very large scale integration application specific integrated circuit tester, thus a VLSI ASCIC tester, e.g., an Agilent 93000 SoC tester. Other VLSI ASIC tester systems may also be used. This means that no extra equipment may need to be purchased from the development labs using the method. Standard equipment may be used for saving costs and improving the testing process at the same time.

In one advantageous embodiment of the method, the central electronic complex may be a central processor of a mainframe computer. Such a mainframe computer may, in particular, be an IBM mainframe computer. However, also midrange computer processors like, e.g., an IBM System p may be suitable. And, the method may not be limited to these processors. Any other processor of any other computer systems may be used.

In the embodiment of the system as described above, the transforming unit may be independent from a testing device or—in other words—an applying unit. Thus, the transforming device and the testing device or tester may be separate. Different devices may allow a usage of standard equipment for the tester as already discussed above.

It may be noted that embodiments may take the form of an entire hardware implementation, an entire software embodiment or an embodiment containing both, hardware and software elements. In a preferred embodiment, the invention may be implemented in software which includes, but is not limited to, firmware, resident software and microcode.

In one embodiment, a data processing program for execution in a data processing system may be provided comprising software code portions for performing the method, as described above, when the program may be run on a data processing system. The data processing system may be a computer or computer system.

Furthermore, embodiments may take the form of a computer program product, accessible from a computer-usable, or computer-readable medium providing program code for use, by or in connection with a computer or any instruction execution system. For the purpose of this description, a computer-usable or computer-readable medium may be any apparatus that may contain means for storing, communicating, propagating or transporting the program for use, by or in a connection with the instruction execution system, apparatus, or device.

The medium may be an electronic, magnetic, optical, electromagnetic, infrared or a semi-conductor system for a propagation medium. Examples of a computer-readable medium may include a semi-conductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W), DVD and Blu-Ray-Disk.

It should also be noted that embodiments of the invention have been described with reference to different subject-matters. In particular, some embodiments have been described with reference to method type claims, whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular between features of the method type claims, and features of the apparatus type claims, is considered as to be disclosed within this document.

The aspects defined above and further aspects of the present invention are apparent from the examples of embodiments to be described hereinafter and are explained with reference to the examples of embodiments, but to which the invention is not limited.

BRIEF DESCRIPTION OF THE DRAWINGS

Preferred embodiments of the invention will now be described, by way of example only, and with reference to the following drawings.

DETAILED DESCRIPTION OF EXAMPLARY EMBODIMENTS

In the following, a detailed description of the drawings will be given. All illustrations in the drawings may be schematic. Firstly, a block diagram of the method of wafer-level testing of a register programmable integrated circuit will be described. Afterwards, several system components and related elements will be described.

Figure 1:
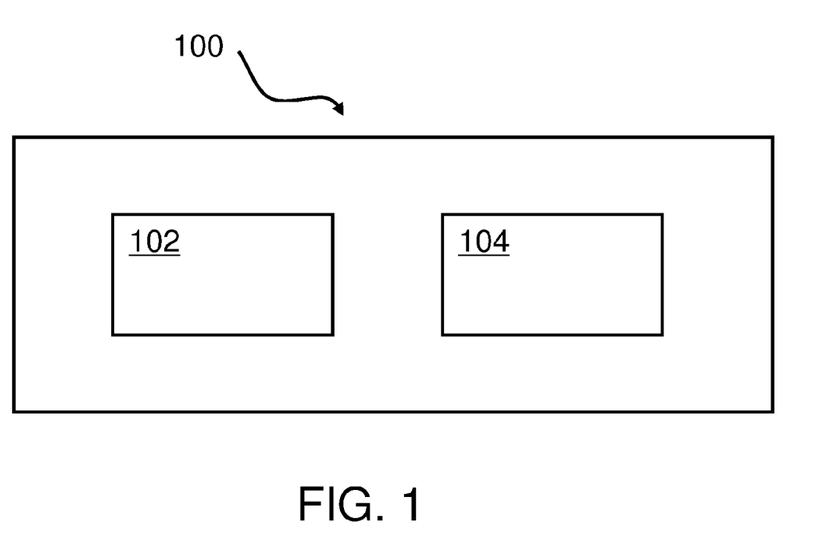
FIG. 1 shows a block diagram of an embodiment of the inventive method of wafer-level testing of a register programmable integrated circuit.

FIG. 1 may show a block diagram of an embodiment of the inventive method of testing a register programmable integrated circuit. The method may comprise transforming, 102, a microcode instruction—in particular a read or write instruction—and related data from an initializing processor format into tester format data, and applying, 104, the tester format data to the integrated circuit on a wafer. The tester format data may have a table form. The microcode may originate and may have been sent by a CEC. The test may be made ASIC by ASIC on the wafer.

Figure 2:
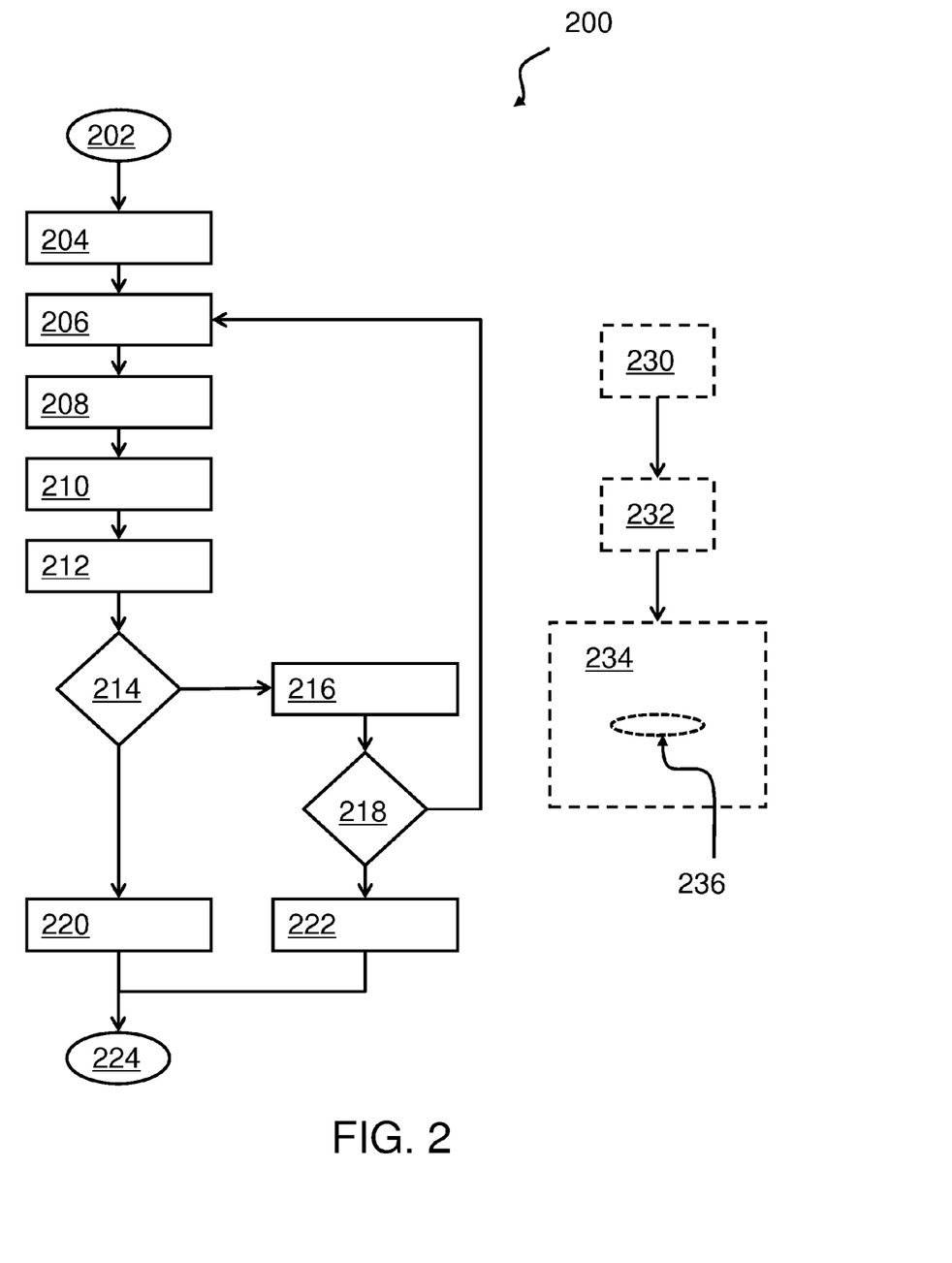
FIG. 2 shows an embodiment of a flow chart describing a main flow of the method.

FIG. 2 may show an embodiment of a flow chart describing a main flow of the method. The method may start at 202. In step 204, a simulation of an I/O ASIC initialization by an I/O initialization microcode in a microcode simulator may be performed. In step 206, a CILS (cache inhibited load/store) trace entry may be generated. This may be a 64-bit wide bit field. Next, the CILS trace entry may be translated, 208, to a tester sequence using a tester specific API (application programming interface) format. In step 210, a specified command, e.g., a read or a write operation may be performed. This command may be sent, 212 as vector pattern via the tester to the DUT, thus, the VLSI ASIC.

The simulator may be a stand-alone device 230. The simulation device may send signals to a tester interface conversion engine 232, which may also be seen as transformation engine. From here, the instructions may be directed to the VLSI ASIC tester 234 comprising the DUT on a wafer 236, in particular the VLSI ASIC, or a plurality of DUTs one after the other.

After the sending of the read and/or write operation in step 212, a global error indicator in the circuit under test—the ASIC—may be read. The indicator may be a register. It may, e.g., have a width of 64 bits.

In step 214, it may be tested whether there may be any "firing error bits" in the global error indicator. If, e.g., one bit may be "on" an error may be signaled. Such a bad status may be returned to the microcode simulator in step 220.

If there may be no error indication in test step 214, a good status may be returned to the microcode simulator in step 216. Next, a test may be performed whether more OILS trace entries may be in the microcode sequence, step 218. If this question may be answered with a "yes", the method may continue with step 206. A next OILS trace entry may be generated.

If no more CILS trace entries may be available in the microcode sequence, i.e., the table, the simulation was successful which may be signaled in step 222. The end of the method may be marked with reference numeral 224.

Figure 3:
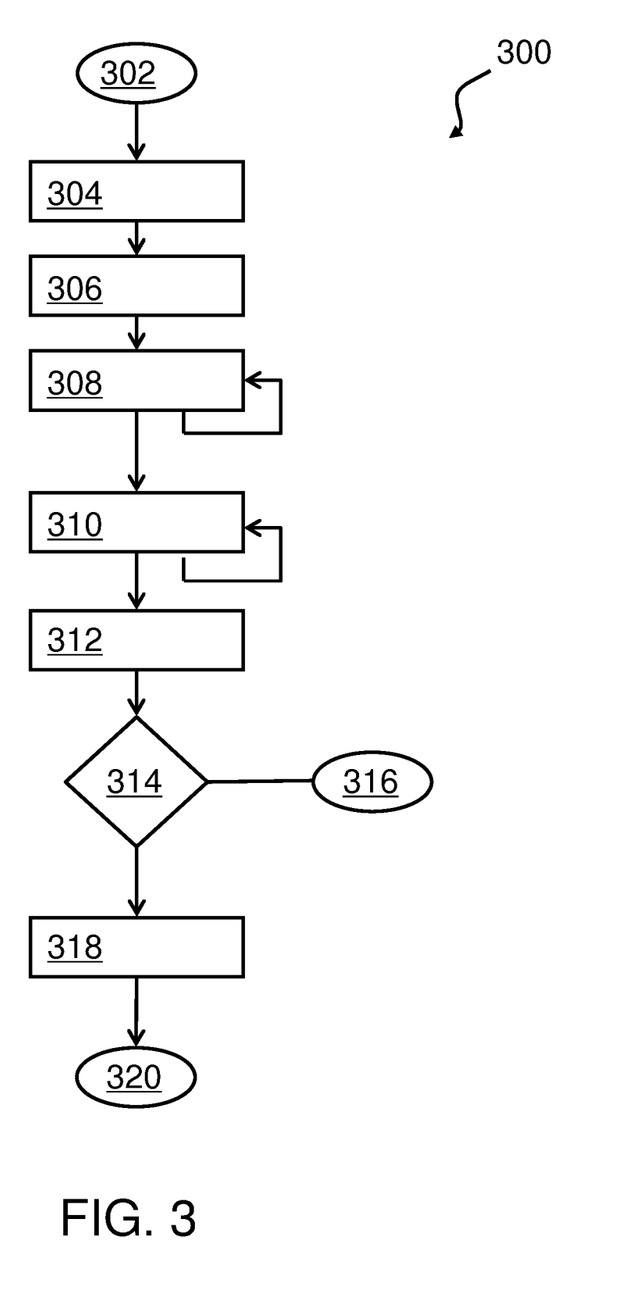
FIG. 3 illustrates a more detailed view of an embodiment of a flowchart of a read command.

FIG. 3 may illustrate a more detailed view 300 on the read command of reference numeral 210 of FIG. 2. The procedure may start at 302. In step 304, an address/value pair in the tester sequence API (application programming interface) format may be provided. In step 306, an n-bit hex register address from the read command (ra=read access) may be fetched and it may be converted to a bit format. These bits may be inserted to a test-data-in (TDI) field of a tester translation table. This tester translation table may be formatted in the form defined by the Joint Test Action Group (JTAG) and standardized by IEEE 1149.1 Standard Test Access Port and Boundary-Scan Architecture. This address field may have the form of table 1.

TABLE 1

| test clock | test-data-in | test-mode-select | test-data-out | Comment (optional) |
| --- | --- | --- | --- | --- |

This last step may be repeated for n address bits. The number "n" may be determined by the width of an address field.

In step 310, the tester may send the JTAG formatted table content to the device(s) under test, pulse-by-pulse, wherein each pulse may be represented by a clock cycle. This may be repeated for m value bits. The number "m" may be determined by the width of a data word. This way, a data field may be generated. The values of test-data-in, test-mode-select and test-data-out may be one bit wide.

In the following step, step 312, an m bit test-data-out array may be received from the tester. The format of this array may be the same JTAG format as discussed above.

In step 314 it may be checked whether there may be any uninitialized bits in the test-data-out bit array. If this question may be answered with "yes" the read operation may be stopped unsuccessful, 316. Otherwise, the test-data-out array value may be converted to a hex-format and it may be saved to a specified value area for further access. Thus, the read operation may successfully be ended.

Figure 4:
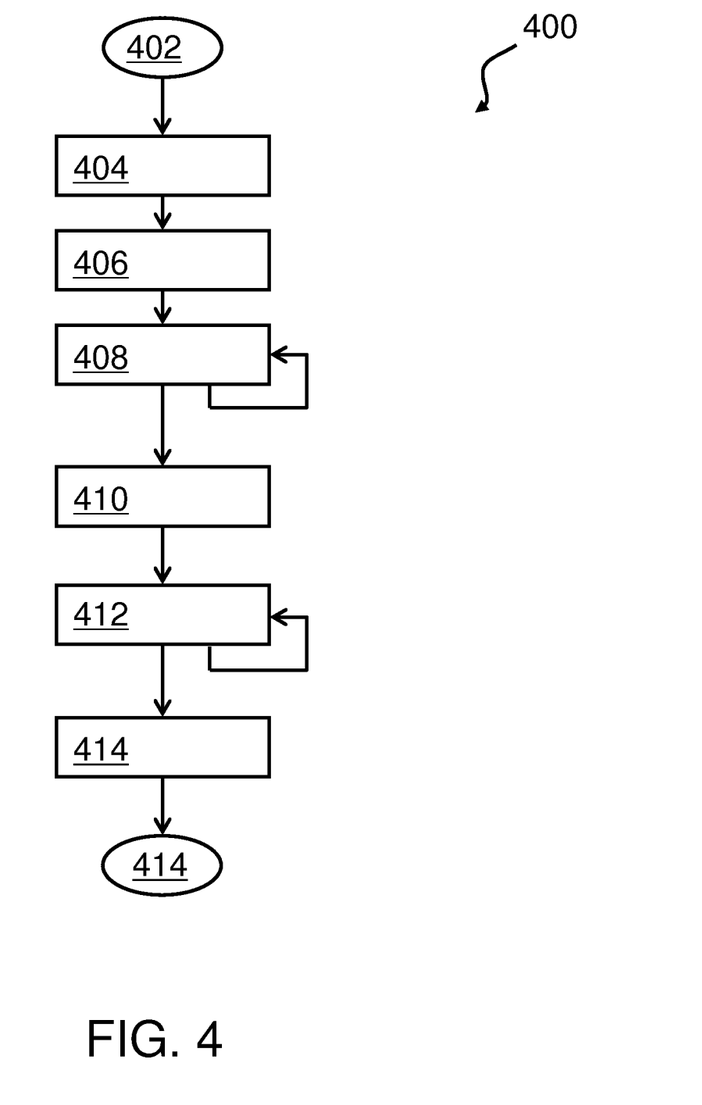
FIG. 4 illustrates a more detailed view of an embodiment of a flowchart of write command.

FIG. 4 may illustrate a more detailed view 400 on the write command of reference numeral 210 of FIG. 2. The procedure may start at 402. In step 404, an address/value pair in the tester sequence API format may be provided. In step 406, an n-bit hex register address from the write command (wa=write access) may be fetched and it may be converted to a bit format forming an address field. These bits may be inserted into a test-data-in (TDI) field of a tester translation table, step 408. This tester translation table may again be formatted in the JTAG format—see table 1. This last step may be repeated for n address bits. The number "n" may be determined by the width of an address field.

In step 410, an m-bit hex register value—in contrast to the address in step 406—from the write command may be fetched and it may be converted to a bit format forming a data or value field or table. These bits from the bit format of the register value may be inserted to the TDI fields of the JTAG formatted tester translation table, step 412. As in the read operations, the tester may send the JTAG formatted table content to the device under test, pulse by pulse, wherein each pulse may be represented by a clock cycle, step 414. This step may be repeated for all m value bits. In 416, the write operation may end.

Figure 5:
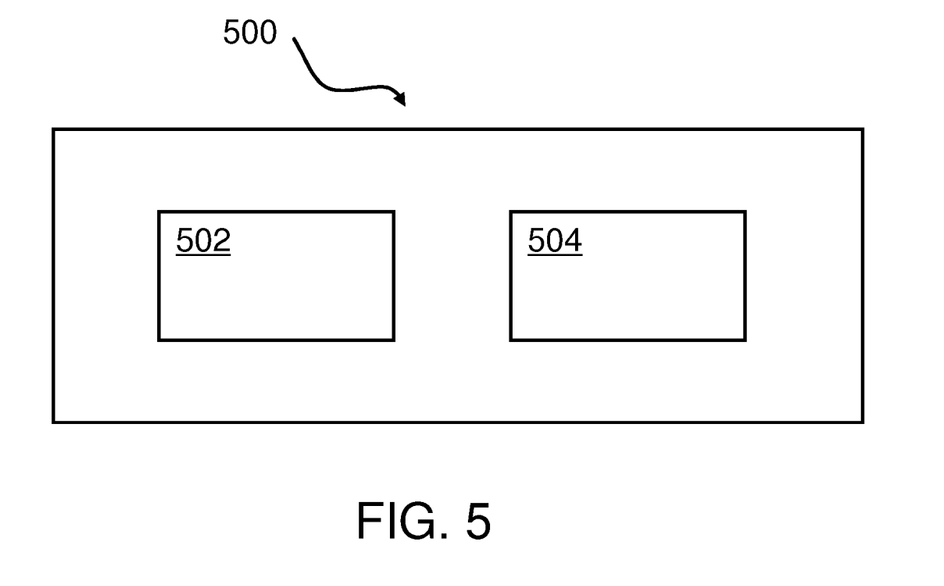
FIG. 5 illustrates a block diagram of an embodiment of the inventive system of wafer-level testing.

FIG. 5 may illustrate a block diagram 500 of an embodiment of the inventive system of wafer-level testing. The system of wafer-level testing of a register programmable integrated circuit may comprise a transforming unit 502 adapted for transforming a microcode instruction and related data from an initializing processor format into tester format data, and an applying unit 504 adapted for applying the tester format data to the integrated circuit on a wafer. As discussed above, this system may allow a testing of devices in the fabrication process at the earliest possible stage with real life data and not with artificially generated data that may never happen in a real-life situation for a device under test.

Figure 6:
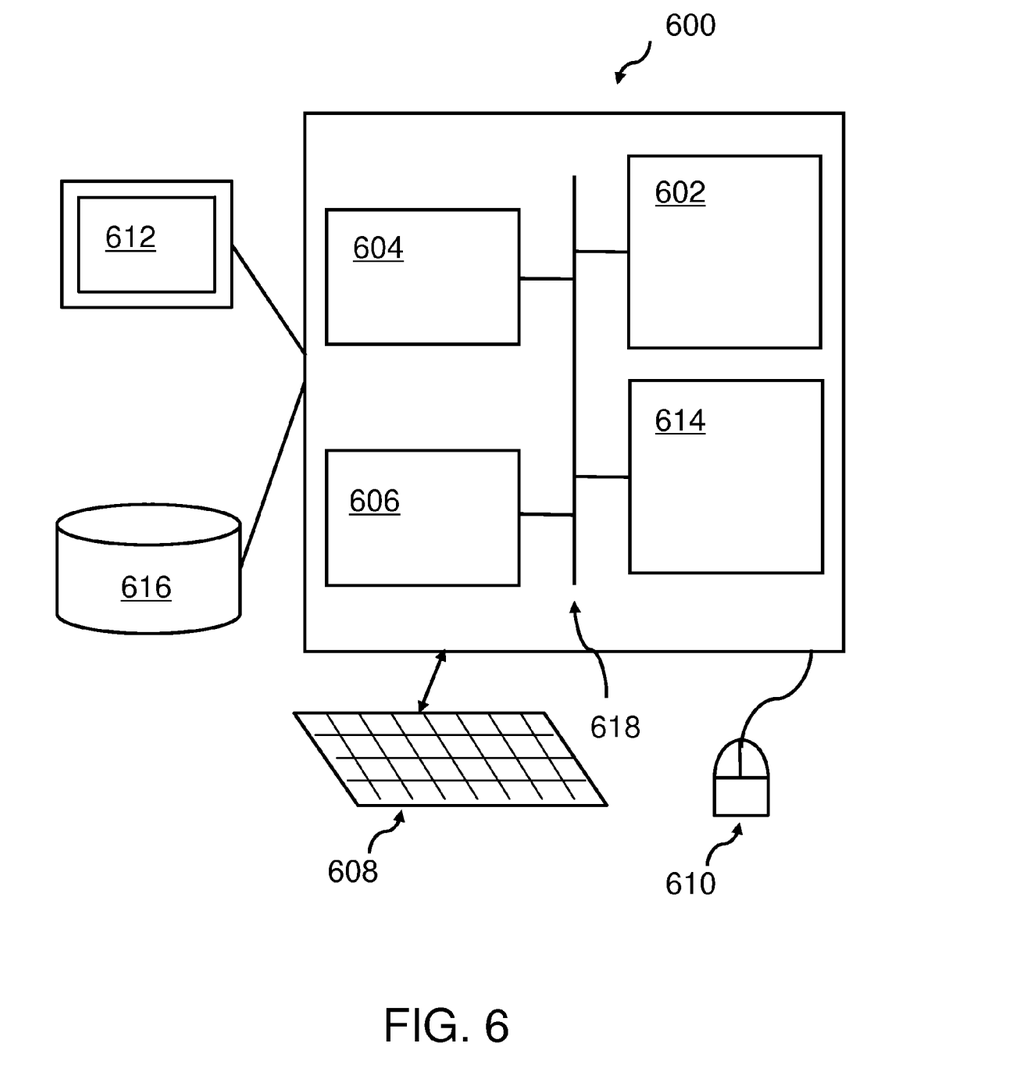
FIG. 6 illustrates a block diagram of an exemplary transforming unit.

FIG. 6 may illustrate an embodiment of the transforming unit in form of a computer system. This system may be independent from a system generating the microcode instruction that may be transformed. However, the two systems may also be the same.

The transforming unit may also be separate but connected to the wafer tester. The wafer tester—or VLSI ASIC tester—may also be seen as the applying unit 234 as discussed above.

The transforming unit may be implemented as virtually any type of computer, regardless of the platform being used suitable for storing and/or executing program code. The computer system 600, may include one or more processor(s) 602 with one or more cores per processor, associated memory elements 604, an internal storage device 606 (e.g., a hard disk, an optical drive such as a compact disk drive or digital video disk (DVD) drive, a flash memory stick, etc.), and numerous other elements and functionalities typical of today's computers (not shown). The memory elements 604 may include a main memory, employed during actual execution of the program code, and a cache memory, which may provide temporary storage for at least some program code or data in order to reduce the number of times, code must be retrieved from external bulk storage 616 for execution.

Elements inside the computer 600 may be linked together by means of a bus system 618 with corresponding adapters.

The computer system 600 may also include input means, such as a keyboard 608, a mouse 610, or a microphone (not shown). Furthermore, the computer 600 may include output means, such as a monitor 612 [e.g., a liquid crystal display (LCD), a plasma display, a light emitting diode display (LED), or a cathode ray tube (CRT) monitor]. The computer system 600 may be connected to a network (e.g., a local area network (LAN), a wide area network (WAN), such as the Internet, or any other similar type of network, including wireless networks via a server network adapter 614. This may allow a coupling to other computer systems as well as to the applying unit that may be adapted for applying the tester format data to the integrated circuit on the wafer as explained above. Those, skilled in the art will appreciate that many different types of computer systems do exist, and the aforementioned input and output means may take other forms. Generally speaking, the computer system 600 may include at least the minimal processing, input and/or output means, necessary to practice embodiments of the invention.

Further, those skilled in the art will appreciate that one or more elements of the aforementioned computer system 600 may be located at a remote location and connected to the other elements over a network. Further, embodiments of the invention may be implemented on a distributed system having a plurality of nodes, where each portion of the invention may be located on a different node within the distributed system. In one embodiment of the invention, the node corresponds to a computer system. Alternatively, the node may correspond to a processor with associated physical memory. The node may alternatively correspond to a processor with shared memory and/or resources.

Further, software instructions to perform embodiments of the invention may be stored on a computer readable medium, such as a compact disk (CD), a diskette, a tape, or any other computer readable storage device.

While the invention has been described with respect to a limited number of embodiments, those skilled in the art, benefiting from this disclosure, will appreciate that other embodiments may be devised, which do not depart from the scope of the invention as disclosed herein. Accordingly, the scope of the invention should be limited only by the attached claims.

It should also be noted that the term "comprising" does not exclude other elements or steps and "a" or "an" does not exclude a plurality. Also, elements described in association with different embodiments may be combined. It should also be noted that reference signs in the claims should not be construed as limiting elements.

The invention claimed is:

1. A method of performing wafer-level testing during production of a register-programmable integrated circuit, the method comprising:
   generating a microcode instruction by simulating a data exchange between a simulated central electronic complex and a simulation of the register-programmable integrated circuit, wherein the microcode instruction includes at least one code element configured for execution by an initializing processor to initialize the register-programmable integrated circuit after production;
   transforming, using a computing device, the microcode instruction and corresponding data from an initializing processor format into tester-formatted data, wherein transforming the microcode instruction includes:
   generating, using the microcode instruction, one or more cache-inhibited load/store (CILS) trace entries, and
   translating the one or more CILS trace entries into a microcode sequence within the tester-formatted data;
   applying, using a tester device coupled with the computing device, the tester-formatted data to the register-programmable integrated circuit; and
   verifying, after applying the tester-formatted data to the register-programmable integrated circuit, the function of the integrated circuit based on a global error indicator included in the register-programmable integrated circuit.

2. The method of claim 1, wherein the applying the tester-formatted data to the register-programmable integrated circuit on the wafer includes at least one of writing the data to the register-programmable integrated circuit and reading other data from the register-programmable integrated circuit.

3. The method of claim 1, wherein the simulation of the register-programmable integrated circuit is performed using a high-level design language simulator or a hardware design language simulator.

4. The method of claim 1, wherein the tester-formatted data are data for a very large scale integration (VLSI) application specific integrated circuit (ASIC) tester.

5. The method of claim 1, wherein the central electronic complex includes a central processor of a mainframe computer.

6. The method of claim 1, wherein the microcode instruction includes at least one of a read instruction and a write instruction for the register-programmable integrated circuit.

7. The method of claim 1, wherein the microcode instruction does not include an artificial code pattern and does not include a pseudo-random pattern.

8. The method of claim 1, wherein translating the one or more CILS trace entries is performed using an application programming interface (API) for the tester device.

9. The method of claim 1, wherein the tester-formatted data is transmitted as a vector pattern to the register-programmable integrated circuit.

10. The method of claim 1, further comprising:
    determining, based on the microcode instruction, whether to generate any additional CILS trace entries for the microcode sequence.

11. The method of claim 1, further comprising:
    translating a register address included within the microcode instruction; and
    including the translated register address in a tester translation table,
    wherein the tester-formatted data applied to the register-programmable integrated circuit includes the tester translation table.

12. The method of claim 11, further comprising:
    receiving, in response to application of the tester-formatted data to the register-programmable integrated circuit, an test-data-out bit array; and
    determining whether the bit array includes any uninitialized bits.

13. The method of claim 12, wherein the bit array is determined to not include any uninitialized bits, and further comprising translating the bit array into a hex format for subsequent access.

14. The method of claim 11, wherein the tester translation table is provided in a format defined by the Joint Test Action Group (JTAG).

15. A system configured to perform wafer-level testing during production of a register-programmable integrated circuit, the system comprising:
- a simulation device configured to generate a microcode instruction by simulating a data exchange between a simulated central electronic complex and a simulation of the register-programmable integrated circuit, wherein the microcode instruction includes at least one code element configured for execution by an initializing processor to initialize the register-programmable integrated circuit after production;
- a computing device including a transforming unit configured to transform the microcode instruction and corresponding data from an initializing processor format into tester-formatted data, wherein transforming the microcode instruction includes:
  - generating, using the microcode instruction, one or more cache-inhibited load/store (CILS) trace entries, and
  - translating the one or more CILS trace entries into a microcode sequence within the tester-formatted data; and
- an applying unit configured to apply the tester-formatted data to the register-programmable integrated circuit,
- wherein the computing device is further configured to verify, after applying the tester-formatted data to the register-programmable integrated circuit, the function of the register-programmable integrated circuit based on a global error indicator included in the register-programmable integrated circuit.

16. The system of claim 15, wherein the applying unit is included in a tester device separate from the computing device.

17. The system of claim 15, wherein the simulation device is a separate device from the computing device that includes the transforming unit.

18. A computer program product to perform wafer-level testing during production of a register-programmable integrated circuit, the computer program product comprising:

a non-transitory computer-readable medium having computer-readable code embodied therewith, the computer-readable code executable by one or more computer processors to:
- generate a microcode instruction by simulating a data exchange between a simulated central electronic complex and a simulation of the register-programmable integrated circuit, wherein the microcode instruction includes at least one code element configured for execution by an initializing processor to initialize the register-programmable integrated circuit after production;
- transform, using at least one of the computer processors, the microcode instruction and corresponding data from an initializing processor format into tester-formatted data, wherein transforming the microcode instruction includes:
  - generating, using the microcode instruction, one or more cache-inhibited load/store (CILS) trace entries, and
  - translating the one or more CILS trace entries into a microcode sequence within the tester-formatted data;
- apply, using a tester device coupled with at least one of the computer processors, the tester-formatted data to the register-programmable integrated circuit; and
- verify, after applying the tester-formatted data to the register-programmable integrated circuit, the function of the register-programmable integrated circuit based on a global error indicator included in the register-programmable integrated circuit.

19. The computer program product of claim 18, wherein the generated microcode instruction does not include an artificial code pattern and does not include a pseudo-random pattern.

* * * * *